United States Patent
Gasser (10) Patent No.: US 8,939,524 B2
(45) Date of Patent: Jan. 27, 2015

(54) SHELTER

(76) Inventor: Erwin Gasser, Belp (CH)

( * ) Notice: Subject to any disclaimer, the term of this patent is extended or adjusted under 35 U.S.C. 154(b) by 231 days.

(21) Appl. No.: 13/419,771

(22) Filed: Mar. 14, 2012

(65) Prior Publication Data

US 2012/0242206 A1 Sep. 27, 2012

(30) Foreign Application Priority Data

Mar. 22, 2011 (EP) .................................... 11159135

(51) Int. Cl.
*H05K 7/20* (2006.01)
*F24F 13/20* (2006.01)
*F24F 1/02* (2011.01)
*A62B 31/00* (2006.01)
*F24F 11/00* (2006.01)

(52) U.S. Cl.
CPC ................. *F24F 13/20* (2013.01); *F24F 1/027* (2013.01); *H05K 7/20609* (2013.01); *A62B 31/00* (2013.01); *F24F 2221/12* (2013.01); *F24F 2221/30* (2013.01); *F24F 2011/0098* (2013.01)
USPC .............................. 312/236; 454/184; 361/696

(58) Field of Classification Search
CPC ........ H04Q 1/035; H01L 23/467; H05K 7/20; H05K 5/00; H05K 7/20445; H05K 7/202; G06F 1/20; G06F 1/206
USPC ................................. 361/692–694, 724–727, 361/679.46–679.49, 679.5, 679.51, 696; 454/184; 174/50; 211/26; 312/236, 312/213, 223.1, 107, 111, 265.1–265.6, 205
See application file for complete search history.

(56) References Cited

U.S. PATENT DOCUMENTS

| | | | | |
|---|---|---|---|---|
| 1,830,305 A * | 11/1931 | Walsh et al. | .................... | 62/417 |
| 1,910,504 A * | 5/1933 | Sellman | ....................... | 312/107 |
| 4,449,579 A * | 5/1984 | Miyazaki et al. | ......... | 165/104.33 |
| 6,579,168 B1 * | 6/2003 | Webster et al. | ............... | 454/184 |
| 6,775,137 B2 * | 8/2004 | Chu et al. | ..................... | 361/696 |
| 7,309,279 B2 * | 12/2007 | Sharp et al. | ................... | 454/184 |
| 7,534,167 B2 * | 5/2009 | Day | ............................. | 454/187 |
| 8,275,417 B2 * | 9/2012 | Flynn | ............................ | 455/561 |
| 8,405,984 B2 * | 3/2013 | Donowho et al. | ............ | 361/692 |
| 8,408,356 B2 * | 4/2013 | Yamaguchi et al. | .......... | 181/198 |
| 8,582,292 B1 * | 11/2013 | Eichelberg | ............... | 361/679.49 |
| 2004/0182799 A1 * | 9/2004 | Tachibana | ....................... | 211/26 |
| 2005/0170770 A1 * | 8/2005 | Johnson et al. | ............... | 454/184 |

(Continued)

FOREIGN PATENT DOCUMENTS

DE 43 28 810 3/1995
DE 199 14 408 A1 10/2000

(Continued)

OTHER PUBLICATIONS

European Search Report dated Aug. 2, 2011 issued in connection with corresponding European patent application No. 11 15 9135.

*Primary Examiner* — Janet M Wilkens
(74) *Attorney, Agent, or Firm* — Ostrolenk Faber LLP (57) ABSTRACT

A shelter comprises an enclosure for delimiting an air-conditionable enclosure interior and a container that is externally mounted to the enclosure and has a container space for receiving a cooling installation. The enclosure comprises at least one passage for heat recirculation from the enclosure interior to the container space. The shelter provides protection against detrimental exterior influences so that a reliable and energy-efficient cooling of the enclosure interior is ensured.

18 Claims, 8 Drawing Sheets

(56) References Cited

U.S. PATENT DOCUMENTS

| | | | |
|---|---|---|---|
| 2007/0272396 A1* | 11/2007 | Campbell et al. | 165/122 |
| 2008/0049396 A1* | 2/2008 | Campbell et al. | 361/696 |
| 2008/0068791 A1* | 3/2008 | Ebermann | 361/687 |
| 2008/0112128 A1* | 5/2008 | Holland | 361/687 |
| 2008/0158815 A1* | 7/2008 | Campbell et al. | 361/696 |
| 2008/0266789 A1* | 10/2008 | Hruby et al. | 361/692 |
| 2009/0129013 A1* | 5/2009 | Donowho et al. | 361/690 |
| 2011/0228470 A1* | 9/2011 | Chang | 361/679.47 |

FOREIGN PATENT DOCUMENTS

| | | |
|---|---|---|
| EP | 1 367 331 | 12/2003 |
| EP | 2 030 651 A1 | 3/2009 |
| WO | WO 2008/128311 A2 | 10/2008 |
| WO | WO 2010/049482 A1 | 5/2010 |

* cited by examiner

SHELTER

FIELD OF THE INVENTION

The invention relates to a shelter comprising an enclosure for delimiting an air-conditionable enclosure interior and a container that is externally mounted to the enclosure and has a container space for receiving a cooling device that is adapted to cool the enclosure interior.

BACKGROUND OF THE INVENTION

Conventionally, such a shelter is used as a transportable protection or storage shelter for information technological equipment or other installations producing waste heat and requiring a regulated ambient temperature for an undisturbed operation. To this end, on the outer wall of the shelter, a container for receiving a ventilation appliance is mounted that ensures the required cooling of the installed equipment through air supply ducts provided in the shelter enclosure. In known shelters, the rejected heat of a condenser installed in the container is dissipated to the shelter environment, which leads to a low efficiency of the condenser particularly at high ambient air temperatures so that the efficiency of the cooling device strongly decreases at high ambient air temperatures.

In the shelter that is known from DE 43 28 810 A1, an ABC protective ventilating unit is further integrated in the container to ensure a contaminant-free air supply. Furthermore, DE 34 06 628 A1 discloses an outer container provided with a casing that is closed on all sides in order to prevent the correct operation of the air-conditioning appliance from being affected by environmental influences such as dust or rain. These measures aim to provide increased protection of the equipment installed in the shelter interior in a twofold manner. On the one hand, the intention is to improve the quality of the supplied fresh air through technical improvements of the external air-conditioning appliance. On the other hand, it is attempted to reduce the susceptibility to disturbances of the air-conditioning appliance by improvements on the container of the appliance mounted on the shelter.

However, it is not taken into account that by a more complex design of the air-conditioning appliance its susceptibility to disturbances increases independently of external factors. In any case, in known shelters, the protected storage of the installed equipment is dependent upon a faultless operation of the ventilation appliance, and possible consequences of a failure are neglected. Overall, it would be desirable to improve the shelter in view of its air-conditioning function and its protection against harmful environmental influences in such a manner that a fail-safe and uninterrupted maintenance of a uniform room conditioning for the sensitive equipment inside the shelter enclosure is ensured in an energy-efficient manner.

OBJECTS AND SUMMARY OF THE INVENTION

It is therefore an object of the present invention to further develop the shelter mentioned in the introduction in such a manner that it provides high protection against damages due to failures of the cooling device or other harmful external influences while a reliable and energy-efficient cooling of the enclosure interior over a longer period is ensured.

Thus, according to the invention, it is suggested that the enclosure comprises at least one passage for heat recirculation from the enclosure interior to the container space. In this manner, a closed heat circuit between the enclosure interior and the container space is provided that is separated from the shelter environment. The closed heat circuit can be advantageously utilized for a reliable and energy-efficient cooling of the enclosure interior which is independent from the momentary temperature of the ambient air. In addition, the closed heat circuit also offers safety-related advantages as the shelter can thus be operated autarkically from the environment and external disturbances can be substantially fully isolated from the shelter interior.

According to a preferred further development it is suggested that the enclosure comprises a fire-resistant material layer for covering an interface area between the container space and the enclosure interior in order to achieve a mutual fire separation. This measure results from the realization that a high risk for the objects of value stored in the shelter may also emanate from potential fire sources within the container space. According to the invention, this risk can be minimized by the fire separation between the enclosure interior and the container space by means of the fire-resistant material layer.

In a preferred embodiment, the fire-resistant material layer is arranged along a wall of the enclosure in such a manner that a fire separation is substantially achieved on the entire surface of the enclosure wall. More preferably, the fire-resistant material layer is provided in all side walls of the enclosure. This ensures a high-grade fire separation of the shelter interior not only with regard to the container space but also to the other adjoining areas of the environment. Most preferred, the bottom and the upper wall of the enclosure are also provided with a fire-resistant material layer.

A high-grade fire protection, more particularly with a fire resistance T90 according to DIN 4102 and a smoke protection RS1 according to DIN 18095, may e.g. be achieved when the fire-resistant material layer comprises a silicate board, more particularly a calcium silicate board. In this manner, heat transmission and/or vapor diffusion can be effectively prevented.

A material of this kind is preferably used as a fire protecting core material that is at least partly surrounded by a self-supporting sheathing on its outer and/or inner surface side. Most preferably, the core material is surrounded by such a self-supporting sheathing both on the outer and on the inner surface sides of the enclosure, whereby a double supporting construction for the fire-resistant material layer is provided. By the nested arrangement of multiple self-supporting material levels, the necessary stability of the shelter required for the protection of the objects of value contained in its interior in the event of fire, particularly against heat and the weight of debris, can be ensured by the self supporting inner supporting construction(s) even if the outer supporting construction melts away. Preferably, such a core material has a thickness of at least 40 mm so that a high fire resistance value is ensured.

As a self-supporting outer and/or inner sheathing, a metal plate, more particularly an inox steel plate, is preferably used. Such a metal envelope allows achieving a high heat reflection and heat redistribution. Besides its properties as a dissipator, the metal envelope may also serve for establishing a high fire resistance value of the underlying fire-resistant material layer. Furthermore, according to a preferred further development, the stable mechanical properties of the metal envelope, particularly of a hard and rugged inox steel envelope, are utilized for providing a safety sheathing of the shelter against intrusion that may e.g. meet the requirements of intrusion resistance WK3 according to DIN V ENV 1627. Furthermore, a Faraday cage against electromagnetic radiation fields (EMP), particularly against lightning and/or compromising external radiation, can be provided in this manner. Preferably, the material of the outer and/or inner sheathing is chosen such that also a protection of the shelter interior against ionizing radiation (NEMP) is provided.

Preferably, also the fire-resistant material layer is designed to be self-supporting in order to ensure high fire protection. To this end, the fire-resistant material layer may be provided at its outer border with a support girder, more particularly a steel girder, to achieve a stable connection to the adjoining enclosure components.

A particular protection against corrosive smoke gases and/or water ingress can be achieved by sealing joints or gaps between individual enclosure components with at least one of fire protecting and water-repellent material, more particularly a fire protection sealant.

Preferably, at least one cooling device for cooling the enclosure interior is arranged in the container space. The cooling device is preferably designed for only cooling the enclosure interior and/or the installations located therein. Alternatively, the cooling device may be at least one air-conditioning device that is also designed for heating the shelter interior when necessary in addition to its cooling.

According to a preferred embodiment of the shelter, the passage for heat recirculation is formed by at least one duct opening for returning warm air from the enclosure interior to the container space. Preferably, two duct openings are provided in at least one side wall of the enclosure which lead to the container space. Furthermore, in the area between the two duct openings, a heat exchanger of a cooling device can be arranged that is adapted to supply air to the shelter interior through one duct opening and to return the air from the shelter interior through the other duct opening. In this manner a closed ventilation circuit between the enclosure interior and the container space is formed which, in addition to a reliable and energy-efficient operation, also offers safety-related advantages since a supply of potentially contaminated fresh air from the environment is not required. Therefore, an additional ABC protective ventilating unit for cleaning fresh air from the environment is not required in such a shelter.

For an optimized cooling of the enclosure interior, the heat exchanger is preferably arranged in the container at medium height, whereby a free space for the incoming and exiting air streams is created in the upper and lower parts of the container space. In the container, more particularly in the upper and lower border areas thereof, deflectors for deflecting the air flow path are preferably provided. Preferably, for an optimum air-conditioning of the shelter interior, the height of the container substantially corresponds to the height of the shelter enclosure.

For an improved ventilation quality, at least one air filter is preferably arranged in the closed ventilation circuit. Preferably, at least two air filters are arranged one after another in the ventilation circuit within the container space. Most preferred, at least one of a coarse dust filter for coarse filtering of the incoming return air is arranged in the upper part of the container and a fine particle filter for the supply air to be discharged is arranged in the lower part of the container.

To achieve an energetically advantageous delimitation of the upper and/or lower part(s) of the container from the middle height region where the heat exchanger is located, at least one intermediate separating plate may be arranged. The separating plate preferably extends substantially over the entire cross-sectional area of the container, whereby a lower container volume for the supply air that is to be discharged through one duct opening and an upper container volume for the return air that is recycled from the enclosure interior through the other duct opening, are separated from one another. In addition to a more efficient utilization of the energy employed for air-conditioning, such a separating plate may also contribute to stabilizing the container, in particular to increase its torsional stiffness.

Preferably, at least one separating plate is formed by a supporting member of an air filter, in particular a coarse dust filter or a fine particle filter, or by a collecting plate for condensation water in the container space. Preferably, on at least one separating plate, a ventilation device is provided. Preferably, one of the air filters, in particular a fine particle filter, is arranged on the pressure side of the ventilation device.

An efficient cooling of the air flow in the container space can be achieved in that the heat exchanger is arranged in the container at medium height, whereby a free space for the incoming and exiting air streams is created in the upper and lower areas of the container space. Preferably, deflectors for deflecting the air flow path are provided in the container, more particularly in at least one of the upper and lower border areas thereof.

A heat exchanger is preferably arranged in the container space in such a manner that its lateral borders extending in the direction of height of the container are inclined with respect to a rear wall of the container. In this manner, the size of the heat exchanging surface can be optimized relative to the available container volume. Furthermore it is thus achieved that the air flow in the container space is guided along the heat exchanging surface in such a manner that an energy-optimized heat dissipation occurs.

The term "heat exchanger" is generally meant to designate a device that allows an exchange of heat energy between two media through a physical and/or chemical process. The heat exchanger may e.g. operate according to the principle of an evaporator unit or be in the form of a cold water cooled heat exchanger. Furthermore, heat exchangers can be used that are suitable for an air cooling or a liquid cooling of the shelter interior and/or of the equipment located therein. Preferably, the heat exchanger is a cooling battery, in particular a finned heat exchanger, which may be used both for air cooling and liquid cooling.

The inclination of the heat exchanger is preferably chosen such that its lower border is located at a greater distance from the rear wall than its upper border. In this manner, the existing container space can be utilized for an energy-efficient air cooling, particularly when a ventilation device is arranged in the area of the lower border of the heat exchanger, whereby an advantageous distribution of the air flow over the container volume can be achieved. Furthermore, the plate-shaped heat exchanger preferably extends over the entire width of the lateral casing of the container.

According to a preferred embodiment of the fire-resistant material layer, the latter includes a static section that is stationary arranged in the interface area between the container space and the enclosure interior and an activatable section by which at least one duct opening between the container space and the enclosure interior can be covered in the event of fire. In this case, at least one ventilation device is preferably used as a cooling device which provides the return air and the supply air from and to the shelter interior through the sealable duct openings.

Preferably, the activatable section is arranged on a side wall of the enclosure and covers a width that corresponds to at least two thirds of the width, preferably substantially the entire width of the side wall. Thus, by an advantageous arrangement of one or multiple duct openings within the sealable width of the enclosure, an optimum ventilation of the enclosure interior can be achieved that is compatible with a highly safe fire protection.

Preferably, the enclosure section comprising the duct openings extends over at least two thirds of the width, more preferred substantially over the entire width of a side wall. In particular, by an accordingly chosen dimensioning of the duct openings, a small temperature difference between the incoming air and the exiting air can be ensured to avoid any damages of the equipment or objects of value installed in the enclosure interior.

Preferably, the activatable section is formed by at least one protection slide that is displaceable between an open position and a closed position of the duct openings provided in the sealable area. A particularly high-grade and fire-proof air supply and air return can be achieved by two protection slides that are arranged so as to be displaceable in opposite directions. More specifically, the technical effect of a mutual weight compensation of these protection slides can be utilized to achieve their activation in the event of fire by a very small force expenditure. This may contribute to the reliability of the activation in the event of fire and moreover allows using heavy-weight high-grade fire protection materials. A protection slide of this kind is known from EP 2 030 651 A1 to the applicant of the present invention, whose disclosure is herewith incorporated into the present patent application by reference.

According to another preferred embodiment of the fire-resistant material layer, in at least one side wall of the enclosure, it substantially consists of a static section that is stationary arranged in the interface area between the container space and the shelter interior, this static section being provided with at least one passage for heat recirculation through which at least one duct of a fluid heat carrier passes. In this case, at least one cooling device designed for liquid cooling is preferably used. In this manner, cooling and heat recirculation from the shelter interior can be ensured by the ducts for the fluid heat carrier. In this manner, e.g. liquid-cooled computer units in the shelter interior can be operated. In this regard, the invention is based upon the realization that the use of such a fluid heat carrier allows a simplification of the fire protection related measures as there is no need to cover the duct openings of a ventilation system in the event of fire.

Furthermore, for energy conservation, an adiabatic cooling device for heat recovery, in particular an ultrasonic water vaporizer may be arranged in the upper part of the container. As a further energy saving measure, at least one device for heat recovery is preferably arranged in the container which absorbs heat from the return air or from the heat fluid, respectively, that is returned from the enclosure interior to the container space, and transmits it to an external energy storage device, in particular a boiler or a heat pump. In the case of liquid cooling by means of a heat fluid, a plate heat exchanger is preferably used for heat recovery which is preferably located upstream of a cooling battery having a large surface area for complete cooling of the heat fluid.

Preferably, the container is mounted to a side wall of the enclosure. On the one hand, a superior cooling can thus be ensured due to the large adjoining surface area of the container space to the enclosure. On the other hand, it can thus be prevented that liquids leaking from the cooling device may reach the enclosure interior, as it may occur when the cooling device is mounted e.g. at the top. According to the invention, to collect such liquids, more particularly condensation water, a collecting container is preferably arranged below the heat exchanger of the cooling device. In a preferred embodiment, the container extends over at least two thirds of the width, preferably substantially over the entire width of the side wall, thereby allowing to further optimize the energy-efficient cooling of the enclosure interior. To provide a container volume that allows a high-grade air-conditioning of the enclosure interior, the container preferably comprises a lateral casing whose width corresponds to at least one tenth of the width of the widest side wall of the enclosure.

Preferably, the container is mounted to the enclosure in such a manner that it is also supported by the enclosure. In this manner, in addition to an easy transportability of the shelter, an easy removal and replacement of the container is possible. The cooling device including the container can thus be designed as an easily exchangeable standard air-conditioning module. In this manner, possible maintenance work is simplified, particularly in the case of a malfunction, a revision, or a replacement of the cooling device. For mounting it to the enclosure, the container is preferably provided with fastening means which laterally project from the container space. More preferred, the fastening means are suspending lugs which allow an easy lateral fastening and replacement of the container. Furthermore, the fastening means are preferably air-sealing.

To ensure a reliable air-conditioning, at least two containers for receiving respective cooling devices are preferably mounted to the enclosure wherein the cooling devices are adapted to cool the enclosure interior independently of each other. In normal operation, when both cooling devices are used simultaneously, a particularly effective cooling of the interior and/or of the equipment located therein can thus be achieved. Furthermore, a special operation of the cooling devices is possible in that only one cooling device is used. Thus, for example, a failure or a revision of one cooling device can be compensated as the cooling of the interior is maintained by the other cooling device without interruption.

A particularly advantageous distribution of the air flow to be supplied to the enclosure interior and returned therefrom can be achieved when two containers are mounted on opposite sides of the enclosure exterior. To ensure a mutually independent and thus redundant operation of the two cooling devices, the containers are preferably connected to separate energy supplies.

In a preferred embodiment of a shelter according to the invention, a cooling device comprising a heat exchanger for air cooling is arranged in one of the containers and a cooling device comprising a heat exchanger for liquid cooling is arranged in the other container. Such a shelter is preferably used for the simultaneous accommodation of liquid-cooled and air-cooled computer units. The opposed arrangement of these differently designed cooling devices allows an advantageous accommodation of the two air-conditioning systems in proximity to the components to be cooled.

Preferably, the shelter is a transportable shelter. A preferred dimensioning of the shelter enclosure results in an enclosure interior that is unsuitable as a workplace for persons and in particular only offers limited walkability. In such an easily transportable and efficiently air-conditionable shelter, the width of the widest side wall of the enclosure is at most three meters, more preferably at most two meters. In particular, by an accordingly chosen dimensioning of the enclosure, a homogenous temperature distribution within the air-conditioned enclosure interior can be ensured to prevent damages of the equipment or objects of value located therein. According to the invention, one or a plurality of such shelters can be placed in a room so that the required cooling energy remains limited to the partial volume of the space to be cooled and energy losses are kept low. Besides shelters that are transportable, shelters that are immovable anchored in the room are also contemplated in the scope of the present invention.

An accordingly dimensioned shelter preferably comprises at least one access door, the side walls for the lateral delimitation of the enclosure interior being no more than twice as wide as the width of the access door. The access door preferably exhibits the dimensions of a person door so as to allow a comfortable placement of objects in the enclosure interior. More preferred, the access door substantially extends over the entire width of the side wall provided with the access door. In this manner, high requirements both with regard to air-conditioning and fire protection can be met and at the same time a high transportability of the shelter is ensured.

To allow an easy insertion of the desired installations, a second access door is preferably provided in the opposite side wall. Thus, for example, the width of the interior that is delimited by the side walls can be optimized for the insertion of 19-inch units, in particular computer servers. The second entrance can be used for networking and cabling of the installed equipment. In addition, passages may also be provided in the top wall of the enclosure to ensure the accessibility of the cabling and more particularly for duct and cable feedthrough. The passages are preferably openings that are easy to seal off for fire and water protection.

Besides the accommodation of highly sensitive technical equipment, the shelter described above can also be used for the protected storage of other environment-sensitive objects. Due to the high quality and the safety of the air-conditioning, combined with a high fire protection and/or intrusion protection, the shelter is particularly suitable for the storage of works of art, library, archive, and museum objects and similar objects of value.

BRIEF DESCRIPTION OF THE DRAWINGS

Hereinafter, the invention is explained in more detail by means of preferred embodiments and with reference to the drawings in which further characteristics and advantages of the invention will become apparent. The figures, the description and the claims include numerous features in combination that can be contemplated and applied in further useful combinations by one skilled in the art. In the drawings:

DETAILED DESCRIPTION OF THE PREFERRED EMBODIMENTS

Figure 1:
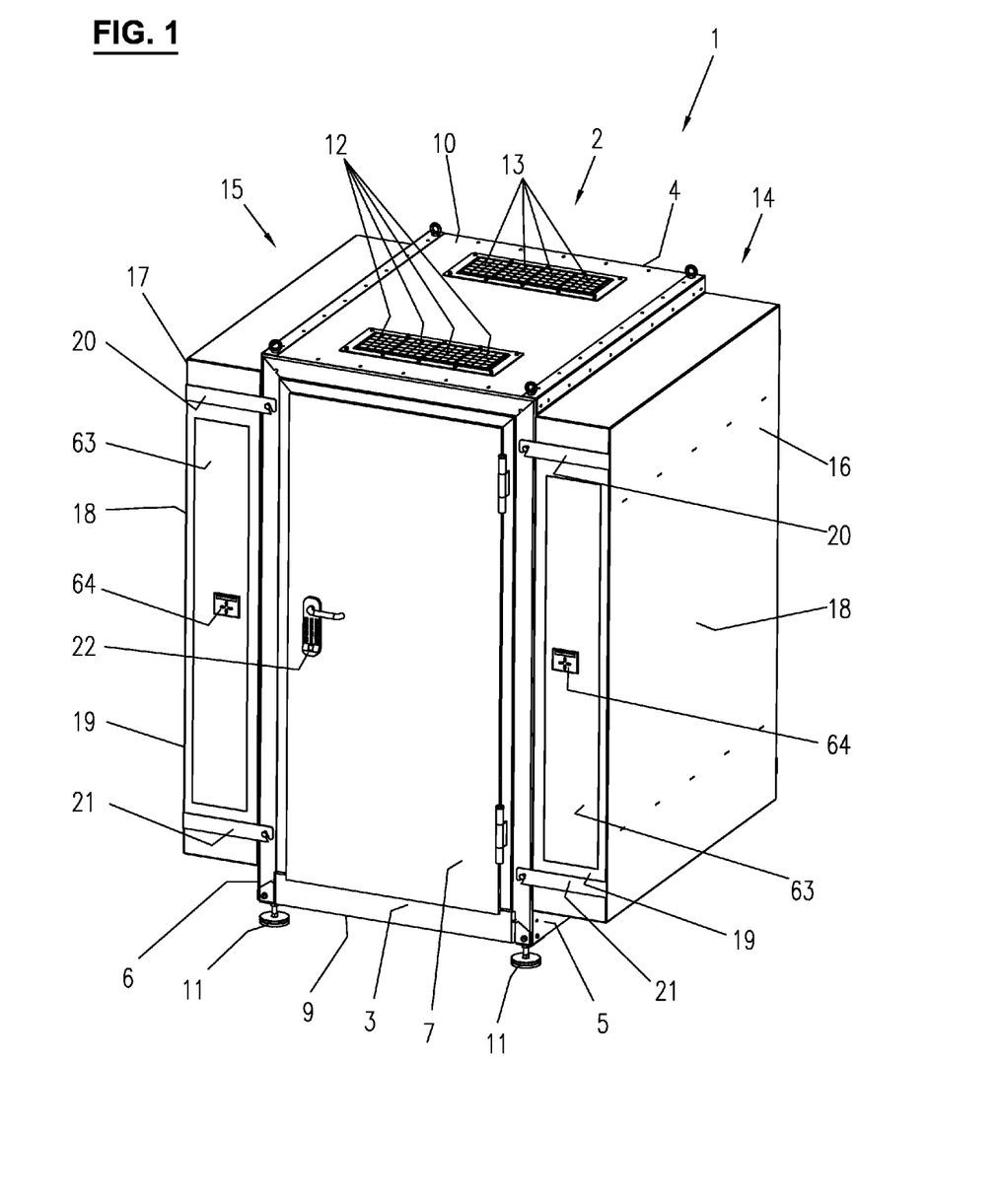
FIG. 1 shows a perspective exterior view of a transportable shelter.
Figure 2:
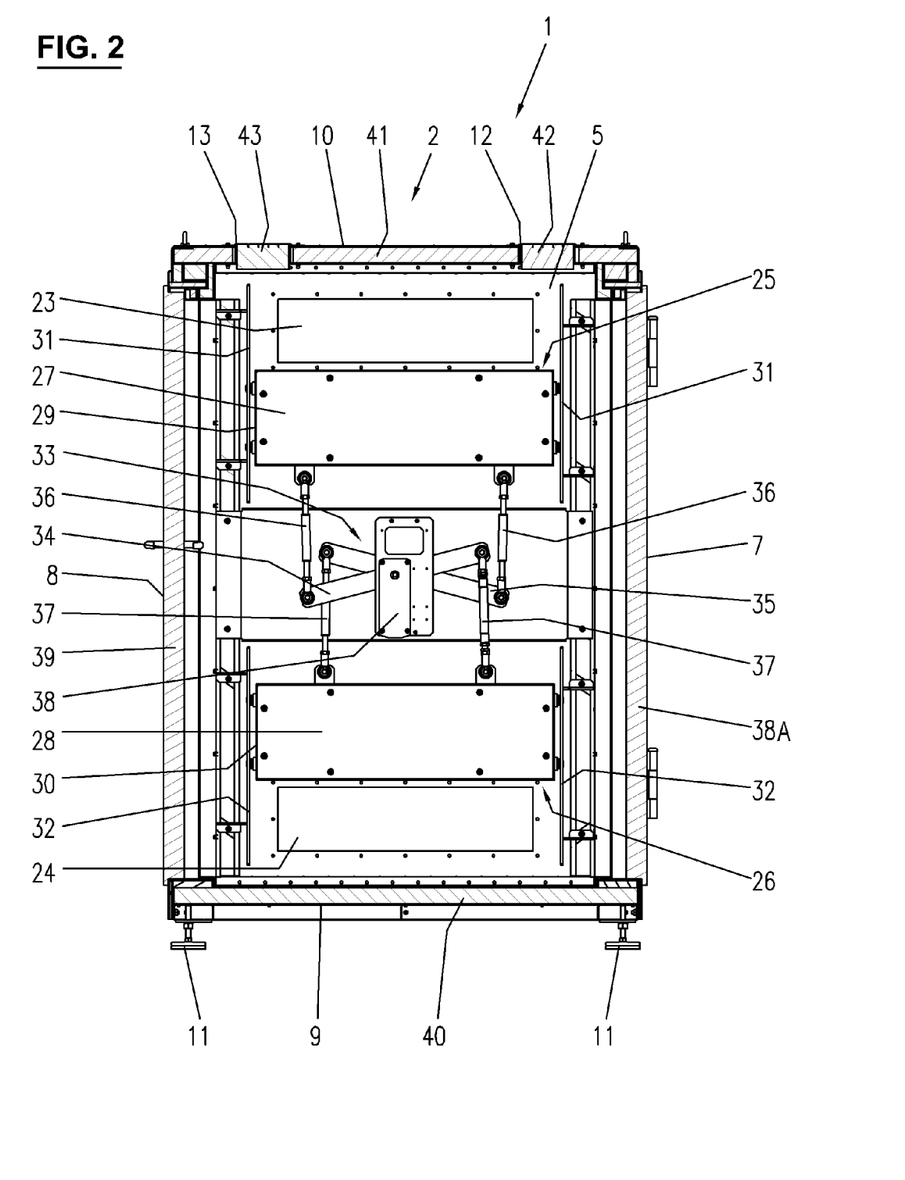
FIG. 2 shows a cross-sectional view of the shelter shown in FIG. 1 along a sectional plane extending in parallel to the laterally mounted air-conditioning modules.
Figure 3:
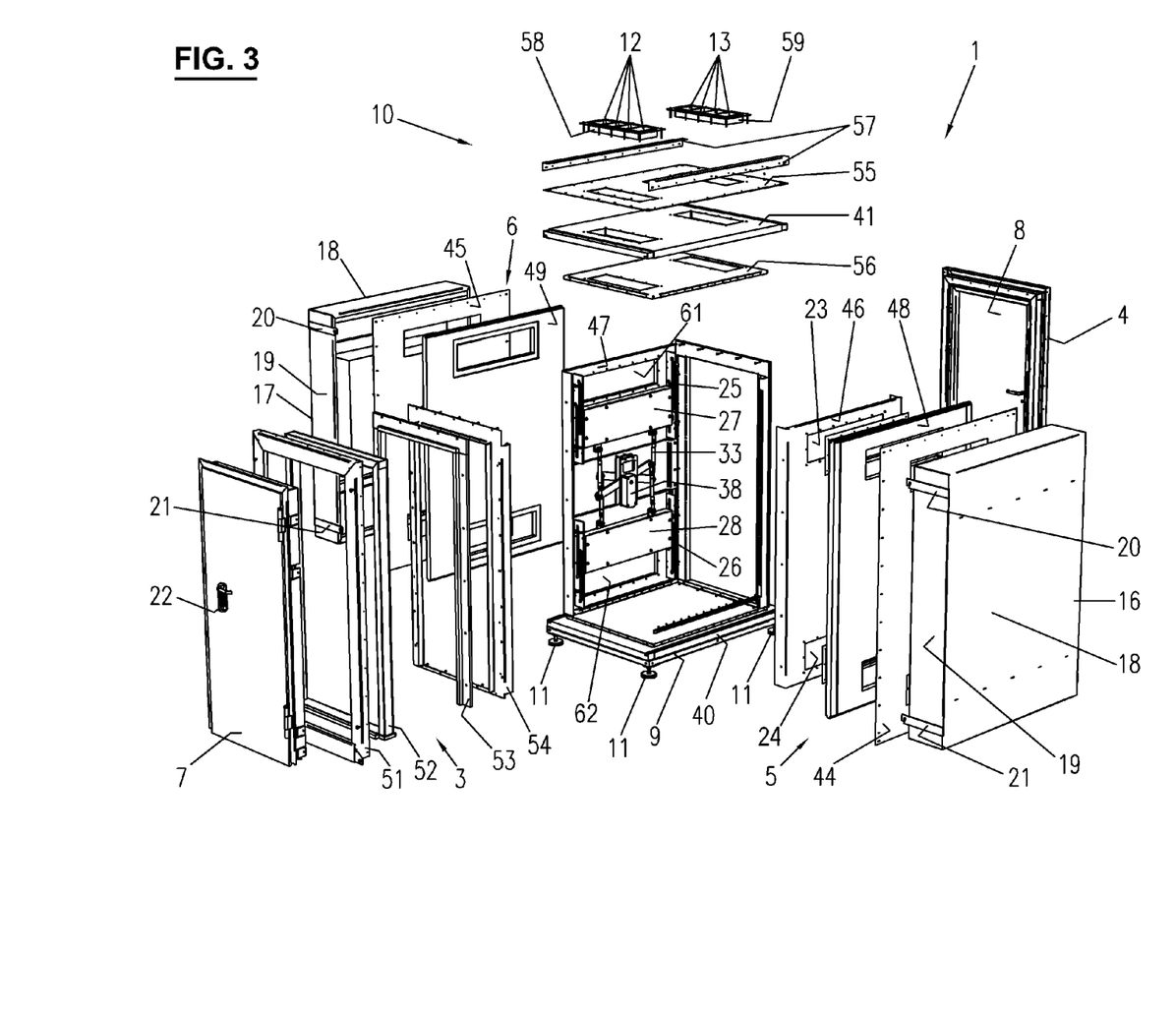
FIG. 3 shows an exploded view of the shelter shown in FIG. 1.

FIG. 1 shows a shelter 1 comprising an enclosure 2 having a shape of a cuboid and delimiting an air-conditionable enclosure interior. The front wall 3 of enclosure 2 is only slightly larger than an access door 7 disposed therein. Another access door 8 of identical construction is arranged in the opposite rear wall 4 (as seen in FIGS. 2 and 3). The width of the two side walls 5, 6 is less than twice the width of front and rear walls 2, 4. To ensure a high transportability of shelter 1 and to provide an efficient and homogenous air-conditionable enclosure interior, the side walls 3-6 have a maximum width of no more than two meters.

Access doors 7, 8 substantially have the dimensions of person doors so as to allow an access by persons. However, due to the dimensions of enclosure 2, the enclosure interior delimited by the latter is not suited for a lasting presence or as a workplace for persons. Therefore, access doors 7, 8 mainly fulfill the function of appliance doors for an easy insertion of objects of value to be stored in the interior of enclosure 2. In this way, for example, 19-inch computer units of conventional IT racks can be comfortably installed in the enclosure interior. In addition, the arrangement of access doors 7, 8 on both sides allows a comfortable connection to power networks and other networks for the installed equipment.

The lower bottom wall 9 of enclosure 2 is supported in the four corner regions thereof by respective height-adjustable support feet 11. Support feet 11 are provided with respective vibration dampers. The upper top wall 10 of enclosure 2 is provided in the region of its front and rear borders with a plurality of easily sealable openings 12, 13 that are suitable for a fire and water protected duct and cable feedthrough.

On the two opposed lateral walls 5, 6, respective air-conditioning modules 14, 15 are mounted. The two air-conditioning modules 14, 15 each comprise a container 16, 17 accommodating a respective cooling device for cooling the enclosure interior delimited by enclosure 2. The containers 16, 17 of identical construction have rectangular rear walls 18. A lateral casing 19 of constant width extends along all four borders of the rear wall 18 of containers 16, 17. In this manner, rear walls 18 and lateral casings 19 of containers 16, 17 and the adjoining side walls 5, 6 of enclosures 2 delimit cuboidal container spaces for receiving respective cooling devices. The width of lateral casing 19 corresponds to about a fifth of the width of the widest side wall 5, 6 of enclosure 2. The thus created container volume allows an excellent air-conditioning particularly of the enclosure interior.

By containers 16, 17, the cooling device arranged therein is substantially completely shielded from the exterior environment of shelter 1. For an air-tight insulation of the container space from the exterior environment of shelter 1, containers 16, 17 are provided at least along their periphery adjoining to enclosure 2 with a flexible, heat resistant insulating band. In addition, the inner wall of containers 16, 17 is provided with nonflammable thermal and noise insulation mats.

The width of the rear walls 18 of containers 16, 17 substantially corresponds to the width of the side walls 5, 6 of enclosure 2. In this manner an optimum air-conditioning of the interior of enclosure 2 can be ensured. The height of containers 16, 17 is slightly smaller than the height of enclosure side walls 5, 6. In this manner, exposed upper and lower surface sections of side walls 5, 6 are provided.

In the upper and lower regions of the front and rear sides of lateral casings 19 of containers 16, 17, suspending lugs 20, 21 are provided which allow an easy lateral disposal and replacement of the respective containers 16, 17 on enclosure 2.

Suspending lugs 20, 21 serve for the air-tight fastening of containers 16, 17 to enclosure 2. To this end, suspending lugs 20, 21 may be provided with an insulating band. Furthermore, additional suspending lugs may be provided in another height region of container 16, 17 in order to reinforce the fastening and/or insulating action.

The front sections of lateral casings 19 comprise respective aperture covers 63 that allow accessing the container space e.g. for an intended filter replacement or a revision of the cooling device. On the inner side of the aperture cover, a control/regulating unit for the cooling device in the container space is fastened, as well as a monitoring unit that is designed for water detection and thermal environment and area monitoring. These electronic components of aperture cover 63 are preferably hermetically sealed from the container space. On the front side of aperture cover 63, a display and/or input device 64 is fastened. This allows e.g. reading or entering safety relevant data regarding the cooling devices or the enclosure interior.

In the outer region of a door handle of access doors 7, 8, a manual input device 22 is arranged, in particular a keypad with a display. Input device 22 preferably includes a device for access control to the enclosure interior, in particular a biometric finger scanner.

On the one hand, such a construction of a shelter 1 allows an easy transportability of shelter 1, in particular on a transport vehicle, crane, lifting car or the like. On the other hand, an autarkically operating shelter is provided that is suitable for a loose installation in the interior of buildings, yet offers a high protection of environment-sensitive objects, in particular against fire, water, corrosive smoke gases, electromagnetic radiation fields (EMP), vandalism, sabotage, and theft. In addition, the advantageous dimensions of shelter 1 allow an optimum air-conditioning of the installed equipment in an energy-saving manner. This is achieved in particular by the arrangement of air-conditioning modules 14, 15 in proximity to the interior of enclosure 2 to be air-conditioned, and by the limited spatial extent of this enclosure interior whereby an unnecessary air-conditioning of unused room volume is kept low.

FIG. 2 illustrates a front view of the inner side of side wall 5 of enclosure 2 as seen from the interior. Side wall 5 has a return air duct opening 23 on its top side and a supply air duct opening 24 on its bottom side by which the interior of enclosure 2 communicates with the external container space. Duct openings 23, 24 extend over more than two thirds of the width of side wall 5 so as to allow an effective ventilation of the enclosure interior.

In front of side wall 5, below return air duct opening 23 and above supply air duct opening 24, respective protection slides 25, 26 are arranged. Protection slides 25, 26 are each formed by a fire-resistant material layer 27, 28, more particularly a highly fire insulating calcium silicate board that is enclosed in a stainless steel frame 29, 30. The covering surface of protection slides 25, 26, which is formed by the surface of fire-resistant material layer 27, 28, is larger than the surface area of the respective associated duct opening 23, 24. Protection slides 25, 26 are displaceable between an open position and a closed position of duct openings 23, 24 along laterally arranged guide rails 31, 32. In the closed position of protection slide 25, 26, the interface area between the container space and the enclosure interior is completely covered by fire-resistant material layer 27, 28 in the region of duct openings 23, 24.

Between protection slides 25, 26, a lever arrangement 33 comprising two lever rods 34, 35 crossing each other is arranged. Protection slides 25, 26 are each hinged to both levers 34, 35 by two respective connection rods 36, 37. The result is a mutual weight compensation of the two protection slides 25, 26 via lever arrangement 33. In spite of their relatively high weight, protection slides 25, 26 are thus displaceable between the open position and the closed position of duct openings 23, 24 by a relatively small force expenditure.

To activate the displacing mechanism of the two protection slides 25, 26 via lever arrangement 33, an activating unit 38 is mounted in the crossing region of lever rods 34, 35. Activating unit 38 comprises a spring return actuator having a spring for transmitting a torque to lever arrangement 33 whereby protection slides 25, 26 are displaceable from the open position to the closed position of duct openings 23, 24. The spring return actuator further comprises a motor for winding the spring whereby protection slides 25, 26 can be returned from the closed position to the open position of duct openings 23, 24. In the event of fire, activating unit 38 is e.g. triggered by a thermoelectric signal or a power failure.

Further technical features and advantages of the above fire protection device with protection slides 25, 26 for duct openings 23, 24 are found in EP 2 030 651 A1 to the applicant of the present invention.

The two access doors 7, 8 as well as bottom wall 9 and top wall 10 are provided along their entire area of extension with respective fire-resistant material layers 38A-41 that are each formed by a highly fire-proof calcium silicate board. Moreover, openings 12, 13 in top wall 10 are sealed by such fire-resistant material layers 42, 43.

In the exploded view of shelter 1 according to FIG. 3, the modular structure of enclosure walls 3-6, 9, 10 is shown in greater detail. Side walls 5, 6 comprise respective outer wall sheathings 44, 45, inner wall sheathings 46, 47, and fire-resistant material layers 48, 49 arranged therebetween. In all these components 44-49 of side walls 5, 6, mutually corresponding apertures for duct openings 23, 24, 61, 62 are provided. The two duct openings 61, 62 of left-hand side wall 6 have the same dimensions as the two duct openings 23, 24 of the right-hand side wall 5 and are located in corresponding opposite positions.

Outer wall sheathings 44, 45 and inner wall sheathings 46, 47 each consist of stainless steel plates of a self-supporting construction. Fire-resistant material layer 48, 49 is fixed at its lower outer border to support girders so that the parts of side walls 5, 6 located between outer wall sheathings 44, 45 and inner wall sheathings 46, 47 are self-supporting, too. The support girders are C-shaped steel girders that are connected to bottom wall 9. The fire-resistant material layers 48, 49 each consist of highly fire-insulating calcium silicate boards. The self-supporting outer wall sheathings 44, 45 and inner wall sheathings 46, 47 additionally support the fire-resistant material layers 48, 49. The three nested self-supporting material layers comprising inner layers 46, 47, intermediate layers 48, 49, and outer layers 44, 45 ensure a high stability of the shelter construction even in the event of fire and when side walls 5, 6 partly melt away. Furthermore, a high protection against intrusion to the interior of enclosure 2 is provided.

The fire-resistant material layers 48, 49 form a static fire-resistant section 48, 49 that is stationary and arranged in an interface area between the container space and the interior of enclosure 2. Thus, together with the activatable fire-resistant sections 27, 28 of protection slides 25, 26, an interface area between the container and the enclosure interior can be completely sealed and fire-protected.

Front and rear walls 3, 4 are formed by access doors 7, 8 and a four-part frame structure 51-54. The frame structure comprises a fire-resistant material layer 52 of calcium silicate enclosed between steel frames 51, 53, 54.

The fire-resistant material layer 41 of top wall 10 is covered on its upper and lower surfaces by respective wall sheathings 55, 56 of stainless steel and fastened to the latter by two lateral bars 57. The individual fire-resistantly sealable openings 12, 13 are formed by two inserts 58, 59 in dedicated apertures in wall sheathings 55, 56 and in fire-resistant material layer 41.

Figure 4:
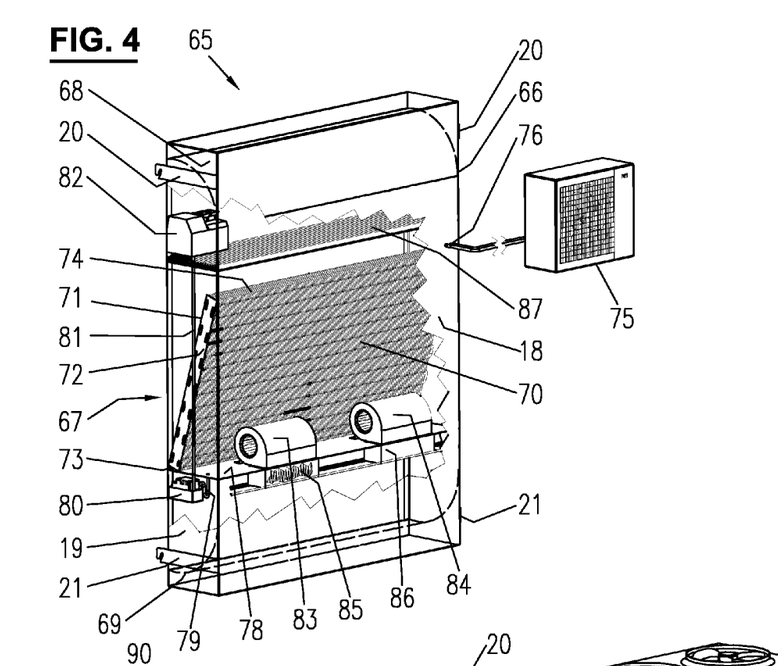
FIG. 4 shows a partly cutaway perspective view of an air-conditioning module according to a first embodiment for the shelter shown in FIG. 1.

FIG. 4 shows an air-conditioning module 65 according to a first embodiment which can be used as an air-conditioning module 14, 15 for shelter 1 described above. To this end, air-conditioning module 65 has a container 66 for receiving a cooling device 67 that has the same features as the previously described containers 16, 17. In the upper part of the container space a curved return air deflector 68 is arranged and in the lower region a curved supply air deflector 69 is arranged which serve for deflecting the air flow path away from return air duct opening 23 and toward supply air duct opening 24. Deflectors 68, 69 substantially extend over the entire width of rear wall 18 and of lateral casing 19 of container 66 in order to achieve an energy-saving and optimum flow through the container space. In particular, a reduction of the outwardly acting pressure and thus a smaller power consumption of a ventilation device 83, 84 is thus achieved.

Cooling device 67 comprises a heat exchanger in the form of a cooling battery 70 that is arranged in the central part of container 66 and extends over about a third of the container height and substantially over the entire width of the container space. Furthermore, heat exchanger 70 is inclined in the container space in such a manner that its lateral borders 72 substantially extend over the entire width of lateral casing 19. In this manner, an optimum exploitation of the surface 71 of heat exchanger 70 by the disposal of an aspirating ventilation device 83, 84 in the closed ventilation circuit between the enclosure and the container is ensured.

Heat exchanger 70 is in the form of a finned heat exchanger that forms an evaporator unit and is connected to a compression cooling unit 75 located outside the container space. The connection is achieved by plug-in couplings 76 that project from rear wall 18 of the container. Compression cooling unit 75 comprises a compressor and a condenser for compressing and condensing the cooling medium required for cooling heat exchanger (evaporator unit) 70. Preferably, an environmentally neutral cooling medium is used. Instead of an on/off valve control, an injection valve 77 operated by a micromotor is built in upstream of heat exchanger (evaporator) 70, which contributes to energy conservation. Injection valve 77 is continuously controlled as a function of the cooling requirements together with the speed-controlled compressor 70 via a data bus.

Along the lower border 73 of heat exchanger 70, a condensate collecting basin 78 is arranged. To discharge the collected condensation water, condensate collecting basin 78 is connected via a siphon 79 to a condensation water tank 80 externally arranged below the basin. Condensation water tank 80 comprises a pump and a nonreturn valve. By a vertical pipe 81, condensation water tank 80 is connected to an ultrasonic vaporizer 82 arranged in the upper part of the container. In this manner, the condensation water accumulated in condensation water tank 80 can be pumped up to the ultrasonic vaporizer 82 and vaporized therein by cavitation, in particular by the vibrations of a piezo crystal. The vaporized condensation water is recirculated into the ventilation circuit by the ultrasonic vaporizer 82 and thus contributes to an increase of the cooling efficiency in an energy-saving manner.

The inclination of heat exchanger 70 in container 66 is chosen such that the lower border 73 on the supply air side is located at a greater distance from rear wall 18 than the upper border 74 on the return air side. In the thus formed space between rear wall 18 and the lower surface section of heat exchanger 70, two or more fans 83, 84 are arranged. The suction side of fans 83, 84 is thus arranged in proximity to the back side of heat exchanger 70, thereby contributing to a power-optimized utilization of the entire surface of heat exchanger 70. Furthermore, an advantageous arrangement of the fan assembly 83, 84 close to rear wall 18 results whereby an optimum distribution of the produced air flow within the container space is achieved. The result is an excellent ventilation of shelter 1 in an energy-saving manner. The rotation speed of fans 83, 84 is preferably controllable and adjustable as a function of the required cooling power.

On the pressure side of fans 83, 84, in the lower part of the container, respective fine particle filters 85, 86 are arranged. Fine particle filters 85, 86 have an activated carbon coating whereby particularly dust particles, corrosive vapors, and gases are filtered out of the supply air discharged from the container space.

A coarse dust filtering of the return air entering the container space is already achieved by a coarse dust filter 87 that is arranged in the upper part of the container between ultrasonic vaporizer 82 and heat exchanger 70. The coarse dust filter holder 87 is a cassette coarse dust filter that includes a filter holder and exchangeable filter elements. Coarse dust filter 87 is substantially plate-shaped and provided with large air outlet openings. It extends over the entire container cross-section in the horizontal direction. Thus, the torsional stability of container 66 is additionally increased.

By the filter holder of coarse dust filter 87 and by the plate-shaped condensate collecting basin 78, the container space is divided into three volume sections along its height. The upper volume section serves for receiving the warm return air, the middle volume section contains the filtered and possibly humidified return air, and the lower volume section serves for discharging the cooled supply air. For the airtight separation of these volume sections from each other, respective insulating bands are arranged in the area of the front borders of the plates 78, 87 adjoining to shelter enclosure 2.

Figure 5:
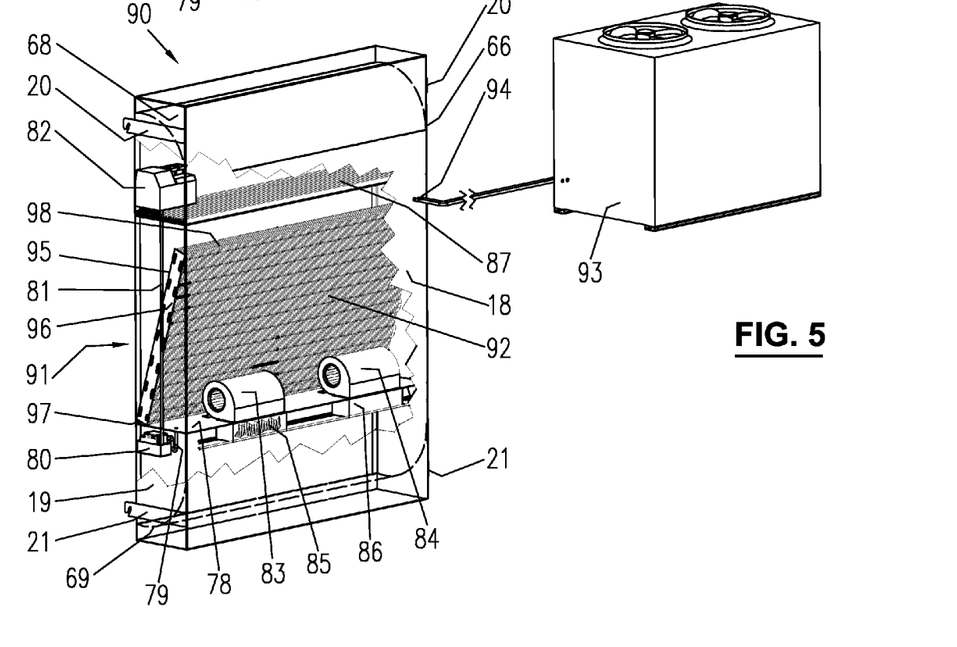
FIG. 5 shows a partly cutaway perspective view of an air-conditioning module according to a second embodiment for the shelter shown in FIG. 1.

FIG. 5 shows an air-conditioning module 90 according to a second embodiment which can be used as an air-conditioning module 14, 15 for shelter 1 described above. Air-conditioning module 90 is identical in construction to the previously described air-conditioning module 65 with the difference that the cooling device 91 therein uses a heat exchanger in the form of a cooling battery 92 whose cooling fluid is provided by a cold water aggregate 93.

Cold water aggregate 93 is located outside container 66 of air-conditioning module 90 and is connected to the coolant pipes of the cold water operated heat exchanger 92 by corresponding plug-in couplings 94 projecting from rear wall 18 of container 66. For an energy-saving operation, the cold water circuit is preferably equipped with components for energy conservation, in particular a device for cooling the fluid without operating the compression cooling unit ("free-cooling") by utilizing the outside temperature, in particular below 12° Celsius.

Heat exchanger 92 is a finned heat exchanger and again extends approximately over the middle third of the height of container 66 and is inclined in such a manner that its lower border 97 on the supply air side is located at a greater distance from rear wall 18 than its upper border 98 on the return air side. The lateral borders 96 of heat exchanger 92 substantially extend over the entire width of lateral casing 19. In this manner, similar to the previously described air-conditioning module 65, the surface area 95 of heat exchanger 92 is optimally utilized. Furthermore, by the ventilator 83, 84 located in the area of lower border 97, an advantageous distribution of the air flow within the existing container space is achieved. Also, the overall large surface dimensions of heat exchanger 92 contribute to energy conservation so that preferably cold water at a temperature above the dew point can be used in order to exclude latent losses e.g. by water precipitation.

Figure 6:
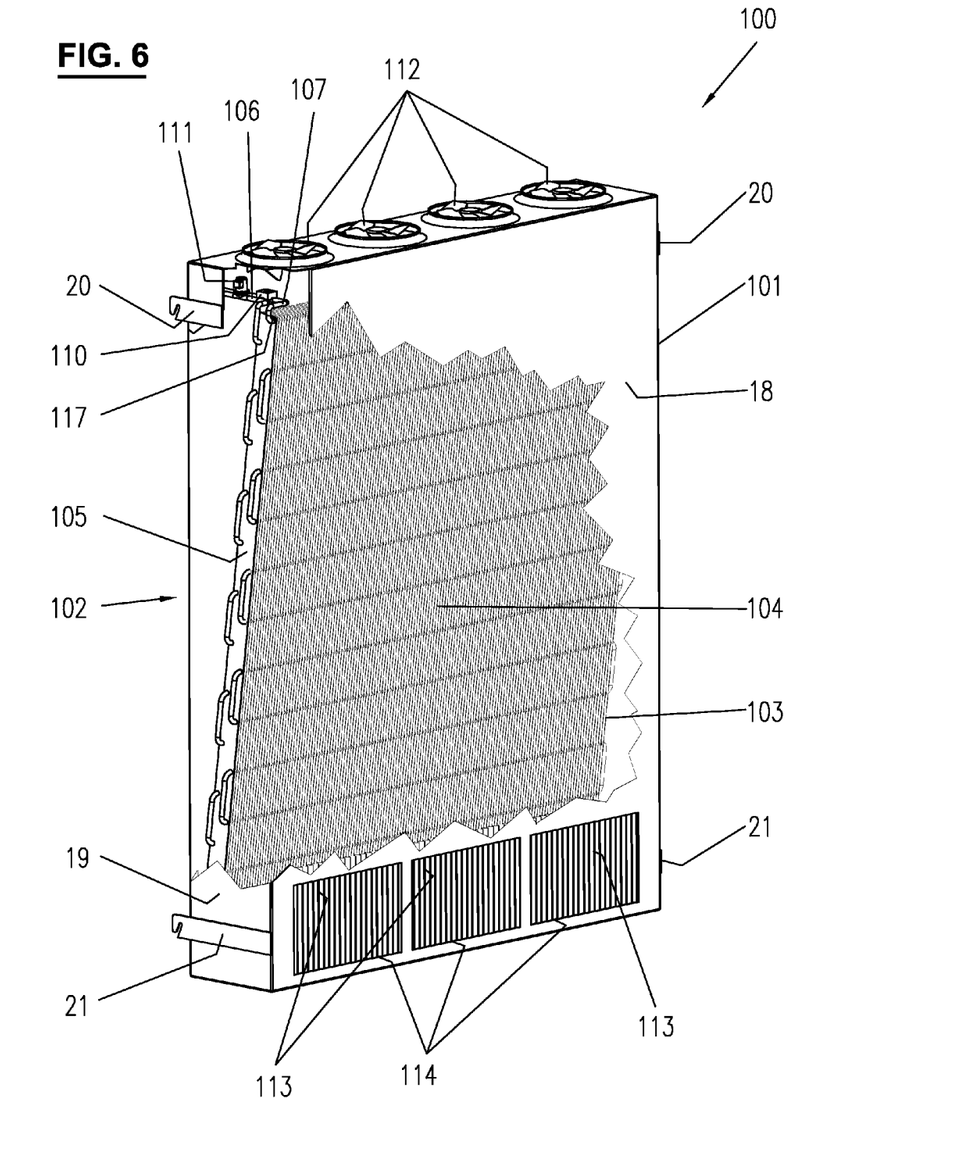
FIG. 6 shows a partly cutaway perspective view of an air-conditioning module according to a third embodiment for the shelter shown in FIG. 1.

FIG. 6 shows an air-conditioning module 100 according to a third embodiment which can be used as an air-conditioning module 14, 15 for the shelter 1 described above. Air-conditioning module 100 differs from the previously described air-conditioning modules 65, 90 both by its container 101 and by the cooling device 102 accommodated therein. Individual components of substantially identical construction are designated by the same reference numerals.

Cooling device 102 comprises a finned heat exchanger 103 that extends substantially over the entire height of container 101. In order to further optimize the surface 104 available for the heat exchange, heat exchanger 103 is inclined in the container space, its lower border 116 being located at a greater distance from rear wall 18 than its upper border 117. The lateral borders 105 of heat exchanger 103 substantially extend over the entire width of lateral casing 19 of container 101.

Figure 9:
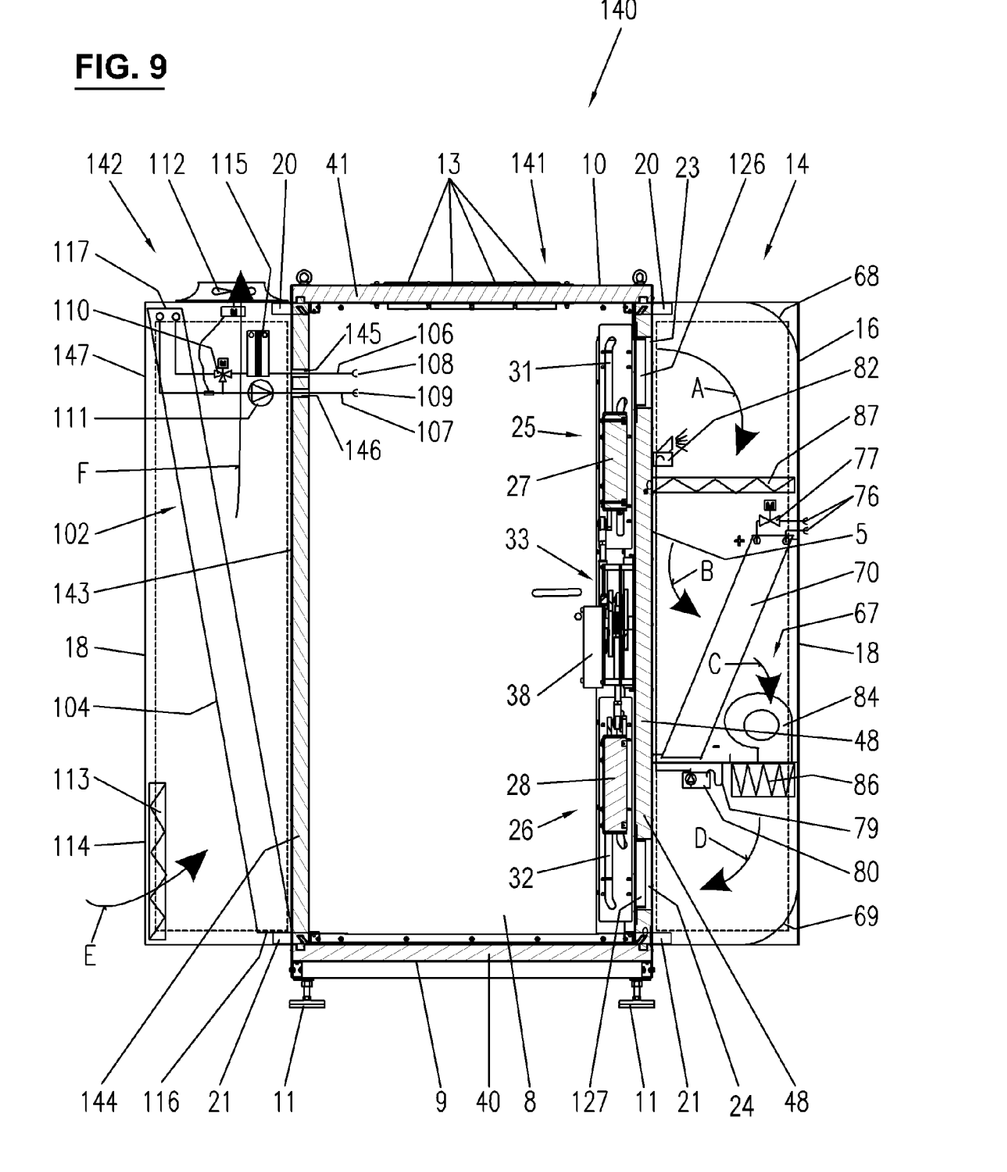
FIG. 9 shows a cross-sectional view of a shelter according to a third embodiment along a sectional plane extending perpendicularly to the laterally mounted air-conditioning module.

Heat exchanger 103 is used as a dissipator for liquid cooling. The latter is preferably in the form of a finned heat exchanger 103. Thus, for example, heat exchanger 103 can be connected to computer units having water-cooled microprocessors. For this purpose, pipes 106, 107 for liquid supply and liquid return extend between the front side of container 101 and heat exchanger 103. Liquid pipes 106, 107 are arranged in the upper part of the container. At their front ends, pipes 106, 107 have respective couplings 108, 109 (as seen in FIG. 9), in particular for connection to a fluid distributor located in the interior of shelter enclosure 2. Furthermore, pipes 108, 109 are equipped with a mixing valve 111 for stabilizing the fluid temperature. To circulate the cooling fluid in piping circuit 106, 107, a circulating pump 110 is used.

Before its entry into finned heat exchanger 103, a plate heat exchanger 115 is arranged in fluid return pipe 106, as seen in more detail in FIG. 9. Plate heat exchanger 115 is preferably used for heat recovery, e.g. for heating a boiler or for heat supply to a heat pump.

On the upper side of enclosure 101, several fans 112 are arranged. Fans 112 are preferably used only when excess warm air is produced in the container space that cannot be compensated by the heat recovery via plate heat exchanger 115 or when excess heat is present that can no longer be absorbed by the external consumers so that the temperature in the fluid supply line exceeds a specified value. To optimize the cooling efficiency, the suction side of fans 112 is located in proximity to the entrance of fluid return pipe 106 into finned heat exchanger 103. Furthermore, the rotation speed of fans 112 is preferably controlled as a function of the cooling power. In the lower part of rear wall 18 of enclosure 101, openings 114 provided with dust filters 113 are arranged which serve for supplying the cooling ambient air to the container space.

By the described air-conditioning modules 65, 90, 100 it is possible to arrange the essential components for air-conditioning in proximity to enclosure 2, thereby allowing an energy-saving air-conditioning of high quality. Also, the described constructive features of enclosure 2 ensure the required thermal, hermetical and physical/mechanical basic protection of the enclosure interior. According to an alternative embodiment, at least one air-conditioning module 65, 90, 100, preferably an air-conditioning module 100 for liquid cooling, can be installed independently from the enclosure wall in an external location. In this manner it is possible to provide an additional component for cooling the enclosure interior besides one or two air-conditioning modules 65, 90, 100 that are directly fastened to the enclosure 2.

Figure 7:
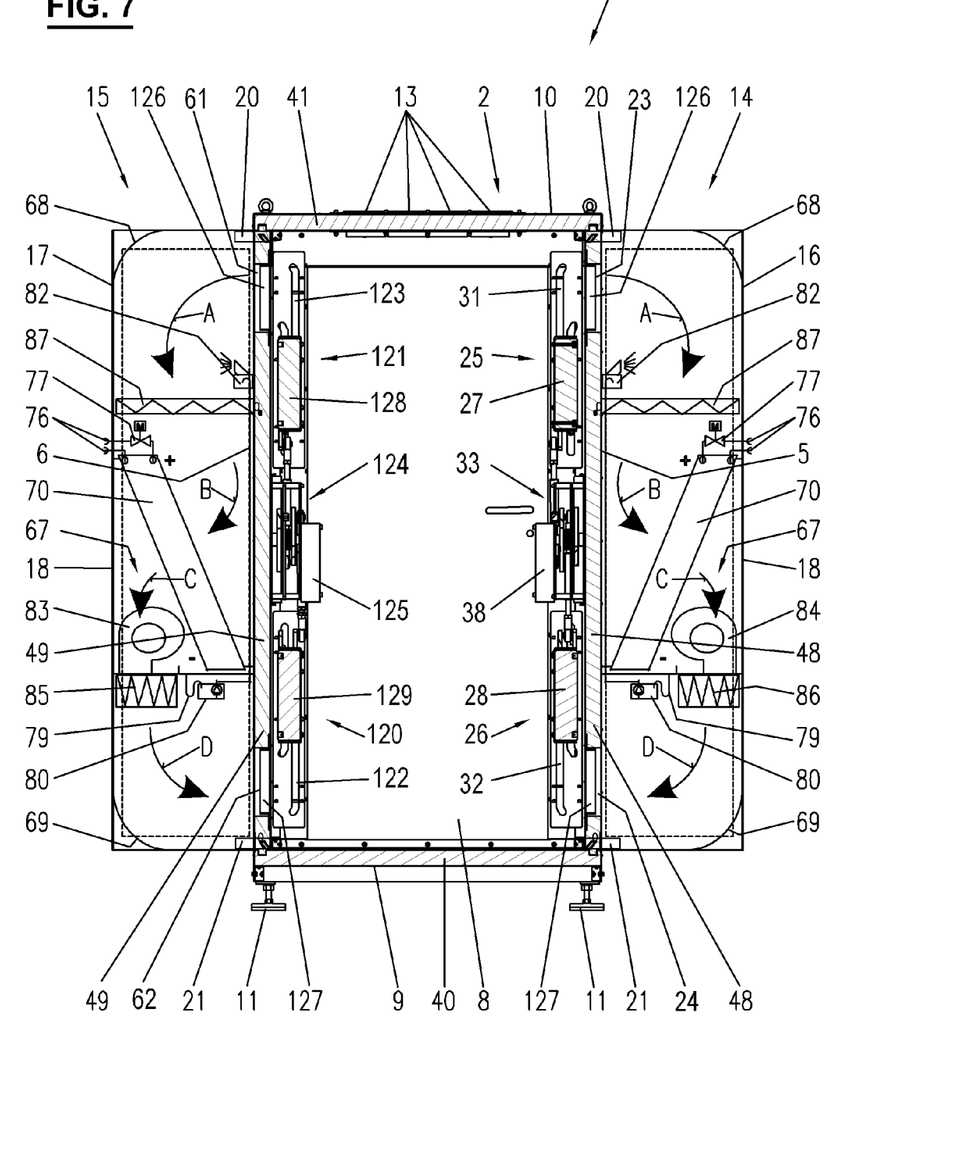
FIG. 7 shows a cross-sectional view of the shelter shown in FIG. 1 according to a first embodiment along a sectional plane extending perpendicularly to the laterally mounted air-conditioning modules.

FIG. 7 illustrates a cross-section through shelter 1 shown in FIG. 1 where air-conditioning modules 14, 15 externally fastened to enclosure 2 are each formed by an air-conditioning module 65 as shown in FIG. 4. Alternatively, instead of air-conditioning module 65 comprising evaporator unit 70 as the heat exchanger, the air-conditioning module 90 comprising cold water heat exchanger 92 shown in FIG. 5 may be used.

As further appears in FIG. 7, two protection slides 120, 121 are arranged on the inner side of side wall 6 which are identical to protection slides 25, 26 on the opposite side wall 5. Accordingly, the fire-resistant material layers 128, 129 of protection slides 120, 121 also consist of highly fire-insulating calcium silicate boards. By means of guide rails 122, 123, protection slides 120, 121 are displaceable between an open position and a closed position of duct openings 23, 24 in side wall 6. Furthermore, for the displacement of protection slides 120, 121, a lever arrangement 124 and an activating unit 125 are arranged on the inner side of side wall 6 which are also identical to the corresponding elements 33, 38 on the opposite side wall 5.

In the upper and lower duct openings 23, 24 and 61, 62 of the two side walls 5, 6, air flow fins 126, 127 are arranged through which the flow direction A of the return air from the enclosure interior to the container space and the flow direction D of the supply air from the container space to the enclosure interior is favored. In the middle container section therebetween, the air circuit is guided through heat exchanger 70 along the flow directions B, C. Thus, due to the advantageous arrangement of fans 83, 84, an energy-optimized utilization of the available container volume and of the surface area of heat exchanger 70 is achieved.

Due to the dual provision of air-conditioning modules 14, 15 and their opposite arrangement, an increased operating reliability is achieved, besides an improved air-conditioning of the interior of enclosure 2, as the required thermal environment can be maintained by the operation of only one of air-conditioning modules 14, 15, if necessary. To this end, air-conditioning modules 14, 15 are connected to separate external power networks and/or external coolant supplies. According to the invention, these advantages can also be obtained with a shelter 1 having two differently designed air-conditioning modules 14, 15, in particular two of the previously described air-conditioning modules 65, 90, 100.

Figure 8:
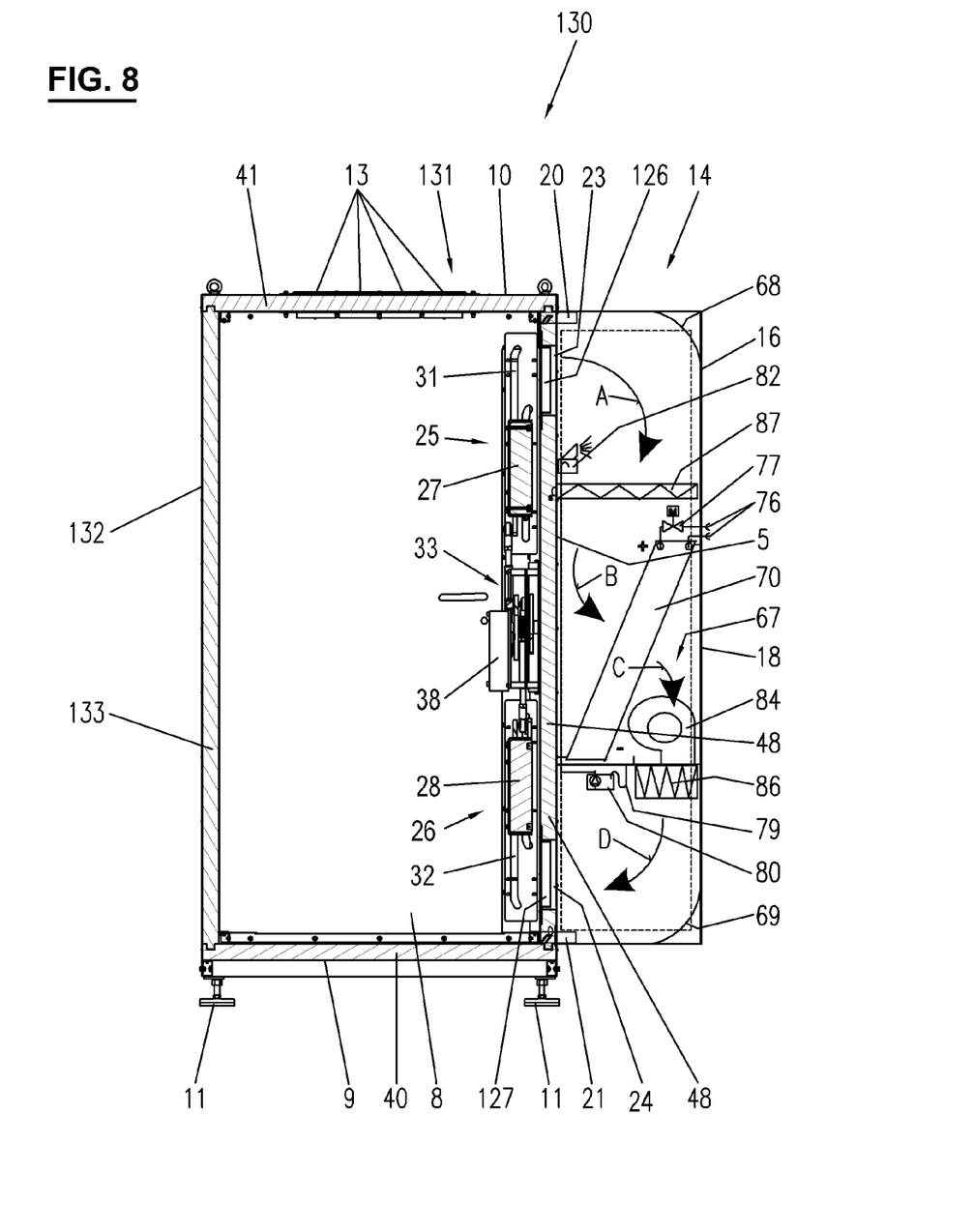
FIG. 8 shows a cross-sectional view of a shelter according to a second embodiment along a sectional plane extending perpendicularly to the laterally mounted air-conditioning module.

FIG. 8 shows a shelter 130 according to a second embodiment. The structure of shelter 130 substantially corresponds to previously described shelter 1 with the difference that only one air-conditioning module 14 is arranged externally. The side wall 132 of the shelter enclosure 131 located opposite to air-conditioning module 14 comprises a fire-resistant material layer 133 that is stationary and arranged throughout. Accordingly, no duct openings 61, 62 and no fire protection slides 120, 121 are provided on shelter side wall 132 similar to shelter side wall 5 with duct openings 23, 24 and fire protection slides 25, 26 bordering air-conditioning module 14. The fire-resistant material layer 133 consists of a calcium silicate board. Shelter 130 offers the advantage of a more compact and less expensive design.

FIG. 9 shows a shelter 140 according to a third embodiment. The structure of shelter 140 substantially corresponds to the previously described shelter 1 with the difference that an alternatively designed second air-conditioning module 142 is externally arranged instead of air-conditioning module 15. As a second air-conditioning module 142, the air-conditioning module 100 shown in FIG. 6 with heat exchanger 103 for liquid cooling is used, in particular for a direct liquid cooling of water-cooled computer units.

Second air-conditioning module 142 is arranged externally on side wall 143 of shelter enclosure 141 located opposite to the first air-conditioning module 14. Side wall 143 comprises a fire-resistant material layer 144 that is stationary arranged throughout and consists of a calcium silicate board. No duct openings 61, 62 and no fire protection slides 120, 121 are provided on side wall 143 similar to shelter side wall 5 with duct openings 23, 24 and fire protection slides 25, 26 bordering air-conditioning module 14. In the upper region of side wall 143, fire-resistantly sealed passages 145, 146 for liquid pipes 106, 107 are provided.

Moreover, in this upper region of side wall 143, fast-closing protection valves for liquid pipes 106, 107 are disposed (which are not indicated in the figure). These protection valves allow a fire-protecting separation between the interior of enclosure 141 and the interior volume of container 147 of second air-conditioning module 142 and also within piping circuit 106, 107 for the cooling liquid. The protection valves are preferably mounted on the outer wall of enclosure 140 and are adapted to be closed without electrical current, e.g. when fire or leaking water or a loss of pressure in the water circuit is detected. In this manner, the interior of enclosure 140 is hermetically sealed from the exterior.

As shown in the cross-sectional view of air-conditioning module 142 in FIG. 9, an optimization of the available heat exchange surface is achieved by the inclined arrangement of heat exchanger 104 in the container space. By the arrangement of fans 112 on the upper side and of openings 114 in the rearward lower part of the container, a flow direction E, F of the incoming and exiting ambient air is obtained that allows an energy-efficient cooling of the heat exchanging surface.

Shelter 140 allows simultaneous liquid and air cooling of the equipment installed in the interior of enclosure 141. By the opposed arrangement of the corresponding air-conditioning modules 14, 142, the climate control advantage of a close, energy-saving accommodation of the cooling devices 67, 102 is combined with the space saving advantage of a compact design of shelter 140. Air-conditioning module 90 comprising cold water heat exchanger 92 shown in FIG. 5 may also be used as the first air-conditioning module 14.

A preferred application of shelter 140 consists in a simultaneous installation of liquid-cooled and air-cooled computer units. Shelter 140 allows an advantageous arrangement of both air-conditioning systems in the direct vicinity of the computer units. The computer units are nevertheless highly protected against neighboring fire sources and against water ingress, theft, etc.

A shelter according to a fourth embodiment of the invention substantially corresponds to shelter 140 shown in FIG. 9 while an additional air-conditioning module whose design corresponds to that of air-conditioning module 142 is externally mounted in place of first air-conditioning module 14. Also in this embodiment, the construction of side wall 5 of enclosure 141 corresponds to that of side wall 143, and the arrangement of protection slides 25, 26 with activating mechanism 33, 38 is omitted. In this manner, a shelter having a redundant liquid-cooled air-conditioning system is realized. Such a shelter offers similar advantages as shelter 1 shown in FIG. 7 having redundant air cooling.

A shelter according to a fifth embodiment of the invention substantially corresponds to one of shelters 1, 130, 140 shown in FIGS. 7-9 while rear wall 4 has no access door 8 but its construction is substantially identical to that of left-hand side wall 132 of shelter 130 shown in FIG. 8. On the inner surface of this rear wall, shelf elements are preferably arranged, in particular manually extensible supporting plates for various objects of value to be stored in the shelter interior.

Another preferred application of shelters 1, 130, 140 shown in FIGS. 7-9 consists of a long lasting protected storage of environment-sensitive objects of value, in particular paintings or other works of art.

From the preceding description, numerous modifications of the shelter according to the invention are accessible to one skilled in the art without leaving the scope of protection of the present invention that is solely defined by the claims.

The invention claimed is:

1. A shelter comprising an enclosure, an enclosure interior, the enclosure delimiting the enclosure interior, at least two containers that are externally mounted to the enclosure, and at least two cooling devices that are adopted to cool the enclosure interior, each of the respective containers of the at least two containers having a container space which receives a respective cooling device, wherein the enclosure comprises at least two passages, at least one passage of the at least two passages being configured for heat recirculation from the enclosure interior to a respective container space,
wherein each of the respective cooling devices are configured to cool the enclosure interior independently of each other, a first cooling device provided in a first container of the at least two containers comprises a heat exchanger, the first container having a first container space, the heat exchanger being configured to cool air recirculated between the enclosure interior and the first container space of the first container, the first container space being one of the container spaces of all of the respective containers and a second cooling device provided in a second container of the at least two containers comprises a heat exchanger, the second container having a second container space, the heat exchanger being configured to cool liquid recirculated between the enclosure interior and the second container space of the second container, the second container space being a second one of the container spaces of all of the respective containers.

2. The shelter according to claim 1, wherein the enclosure comprises a fire-resistant material layer and an interface area between the at least two container spaces and the enclosure interior, the fire-resistant material layer being configured to cover the interface area in order to achieve a mutual fire separation.

3. The shelter according to claim 2, wherein the fire-resistant material layer includes a stationary section that is arranged in the interface area, and an activatable section by which at least one duct opening between the first container space and the enclosure interior can be covered in the event of fire.

4. The shelter according to claim 3, wherein the activatable section is arranged on a side wall of the enclosure and covers a width that corresponds to at least two thirds of the width of the side wall.

5. The shelter according to claim 3, wherein the activatable section is formed by at least one protection slide that is displaceable between an open position and a closed position of the duct opening.

6. The shelter according to claim 2, wherein in at least one side wall of the enclosure the fire-resistant material layer includes a stationary section arranged in the interface area, wherein at least one duct for a fluid heat carrier extends through the passage for heat recirculation.

7. The shelter according to claim 2, wherein the fire-resistant material layer is at least partially surrounded by a self-supporting sheathing on at least one of its outer and inner surface side.

8. The shelter according to claim 1, wherein in at least one side wall of the enclosure two duct openings are arranged which lead to the first container space and are spaced apart in such a manner that in the part of the first container space therebetween the heat exchanger of the first cooling device can be arranged which is adapted to supply air to the enclosure interior through one of the duct openings and to return air from the enclosure interior through the other duct opening.

9. The shelter according to claim 8, wherein at least one separating plate with an air filter is arranged in the first container by which a lower container volume is delimited from an upper container volume.

10. The shelter according to claim 1, wherein the respective heat exchangers provided in the first container and in the second container are arranged in the respective container spaces in such a manner that their lateral borders are inclined relative to a rear wall of the respective first container and the second container.

11. The shelter according to claim 10, wherein the respective heat exchangers extend over the entire width of a lateral casing of the respective first container and the second container.

12. The shelter according to claim 10, wherein in the area of the lower border of the respective heat exchangers a ventilation device is arranged.

13. The shelter according to claim 1, wherein in two opposite side walls of the enclosure respective passages for heat recirculation are arranged.

14. The shelter according to claim 1, wherein each of the first and second containers extends over at least two thirds of the width of a side wall of the enclosure.

15. The shelter according to claim 1, wherein the first and second containers are mounted to opposite side walls of the enclosure.

16. The shelter according to claim 1, wherein each of the first and second containers comprises a lateral casing whose width corresponds to at least one tenth of the width of the widest side wall of the enclosure.

17. The shelter according to claim 1, wherein the enclosure comprises at least one access door to the enclosure interior, the side walls for the lateral delimitation of the enclosure interior being less than twice as wide as the width of the access door.

18. The shelter according to claim 1, wherein air recirculated between the enclosure interior and the first container space is recirculated by a first recirculating device and liquid recirculated between the enclosure interior and the second container space is recirculated by a second recirculating device, which is separate from and operates independently of the first recirculating device.

* * * * *